(12) United States Patent
Kato et al.

(10) Patent No.: US 9,307,636 B2
(45) Date of Patent: Apr. 5, 2016

(54) PRINTED WIRING BOARD

(75) Inventors: Hiroaki Kato, Osaka (JP); Kiyotaka Komori, Fukushima (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 106 days.

(21) Appl. No.: 14/232,595

(22) PCT Filed: Jul. 19, 2012

(86) PCT No.: PCT/JP2012/068394
§ 371 (c)(1),
(2), (4) Date: Jan. 13, 2014

(87) PCT Pub. No.: WO2013/012053
PCT Pub. Date: Jan. 24, 2013

(65) Prior Publication Data
US 2014/0158406 A1 Jun. 12, 2014

(30) Foreign Application Priority Data

Jul. 20, 2011 (JP) .................................. 2011-159279

(51) Int. Cl.
*H05K 1/03* (2006.01)
*H05K 1/02* (2006.01)

(52) U.S. Cl.
CPC .................. *H05K 1/03* (2013.01); *H05K 1/024* (2013.01); *H05K 1/036* (2013.01); *H05K 2201/029* (2013.01)

(58) Field of Classification Search
CPC ................................. H05K 1/03; H05K 1/024
USPC ......................................................... 174/250
See application file for complete search history.

(56) References Cited

U.S. PATENT DOCUMENTS

| 8,367,937 B2 * | 2/2013 | Ho et al. ......................... 174/257 |
| 8,648,260 B2 * | 2/2014 | Ooi et al. ....................... 174/251 |
| 2010/0300619 A1 * | 12/2010 | Hosomi et al. ............. 156/306.6 |

FOREIGN PATENT DOCUMENTS

| CN | 101321813 A | 12/2008 |
| JP | 08-127959 A | 5/1996 |

(Continued)

OTHER PUBLICATIONS

International Search Report issued in International Application No. PCT/JP2012/068394 mailed Oct. 9, 2012, 7 pgs.

(Continued)

*Primary Examiner* — Timothy Thompson
*Assistant Examiner* — Charles Pizzuto
(74) *Attorney, Agent, or Firm* — McDermott Will & Emery LLP

(57) ABSTRACT

An object of the present invention is to provide a printed wiring board which does not require arranging signal lines oblique to the warp or weft threads constituting a substrate and is capable of reducing a difference in transmission rates between the signal lines. The present invention relates to a printed wiring board including: an insulating layer; and a signal layer including a set of at least two signal lines and disposed on one side of the insulating layer. A substrate is embedded inside the insulating layer in such a manner to be further from the signal layer than a center of the insulating layer in a thickness direction of the insulating layer is. The insulating layer has a laminated structure of a thick layer, the substrate, and a thin layer. A ratio of a thickness of the thick layer to a thickness of the thin layer is greater than five.

6 Claims, 6 Drawing Sheets

(56) References Cited

FOREIGN PATENT DOCUMENTS

| JP | 2002-134918 | A | | 5/2002 |
|----|-------------|---|---|--------|
| JP | 2007-176169 | A | | 7/2007 |
| JP | 2008-038066 | | * | 2/2008 |
| JP | 2008-038066 | A | | 2/2008 |
| WO | 2007/126130 | A1 | | 11/2007 |

OTHER PUBLICATIONS

Chinese Office Action issued in Chinese Patent Application No. 201280035126.1, dated Jan. 14, 2016, with English translation.

* cited by examiner

PRINTED WIRING BOARD

RELATED APPLICATIONS

This application is the U.S. National Phase under 35 U.S.C. §371 of International Application No. PCT/JP2012/068394, filed on Jul. 19, 2012, which in turn claims the benefit of Japanese Application No. 2011-159279, filed on Jul. 20, 2011, the disclosures of which are incorporated by reference herein.

TECHNICAL FIELD

The present invention relates to a printed wiring board which is used for manufacture of a variety of electric devices.

BACKGROUND ART

Prepreg is prepared by impregnating cloth, which is formed by interlacing warp and weft threads, with thermosetting resin such as epoxy resin, and subsequently drying it. A laminated board may be prepared by stacking one or more sheets of the prepreg, and then molding it by means of heating and pressing. Thereafter, a printed wiring board is prepared by forming a circuit on a face of the laminated board.

In this regard, the aforementioned cloth is prepared by interlacing parallel warp threads with parallel weft threads at a right angle to the weft threads, and the cloth is formed into a sheet elongated along a longitudinal direction of the warp threads. Moreover, the prepreg, which is prepared by impregnating the cloth as a substrate with thermosetting resin and drying it, is formed into an elongated sheet having a similar shape to the cloth. As shown in FIG. 6A, warp threads 110 are arranged parallel to a side edge "e" along a longitudinal direction of a prepreg sheet 180, and weft threads 120 are arranged at a right angle to the side edge "e" along the longitudinal direction of the prepreg sheet 180. Note that cloth 130 is embedded in the prepreg sheet 180, however, the warp threads 110 and the weft threads 120 of the cloth 130 are shown with solid lines in FIG. 6A.

A laminated board 190 is prepared by stacking at least one of the prepreg sheets 180, and subsequently molding a laminate by means of heating and pressing so as to harden resin 140 (e.g., thermosetting resin) penetrating into the cloth 130. Thereafter, a printed wiring board 200 is prepared by forming a circuit 150 with a predetermined pattern, on a face of the laminated board 190.

FIG. 6B shows the laminated board 190 and the printed wiring boards 200 prepared by forming the circuits 150 on the face of the laminated board 190. With forming the circuits 150 at multiple sites of the single laminated board 190 and thus cutting the laminated board 190 along peripheries of the circuits 150 represented by two-dot chain lines, a plurality of printed wiring boards 200 are obtained from the single laminated board 190.

Note that, to minimize length of lines thereof, the circuit 150 is generally constituted by straight lines as a basic pattern. Besides, in order to increase a density of arrangement of the circuits 150, a straight-line part of the circuit 150 is often formed so as to be parallel to an outer side of the printed wiring board 200 with a rectangular shape. As a result, a straight-line part 151 of the circuit 150 is probably parallel to the warp threads 110 of the cloth 130, and a straight-line part 152 of the circuit 150 is probably parallel to the weft threads 120 of the cloth 130 (in each of FIGS. 6B and 6C, an arrow "X" shows a direction of the warp threads 110 and an arrow "Y" shows a direction of the weft threads 120). In this regard, when the warp threads 110 and the weft threads 120 of the cloth 130 embedded in the printed wiring board 200 as the substrate are provided parallel to the straight-line parts 151 and 152 of the circuit 150, respectively, the following problem is likely to occur.

FIG. 7 is an enlarged cross-sectional view illustrating the printed wiring board 200 obtained by forming the circuit 150 on the face of the laminated board 190. The laminated board 190 is formed in such a manner that the cloth 130 is embedded in the resin 140. Besides, FIG. 7 is the cross-sectional view cut along a vertical plane to the longitudinal direction of the warp thread 110 and shows circuits 150 which are provided parallel to the warp threads 110. Out of the circuits 150 provided parallel to the warp threads 110 as described above, some of the straight-line parts of the circuits 150 are disposed just above the warp threads 110 and the others are disposed above a space between the warp threads 110 and 110.

Glass cloth is typically used as the cloth 130, and a glass fiber of an inorganic substance has a high dielectric constant while resin has a low dielectric constant. In the laminated board 190 prepared by impregnating the cloth 130 with the resin 140 and subsequently hardening the resin 140, a portion including the warp threads 110 of glass fibers and the weft threads 120 of glass fibers has a high dielectric constant. In contrast, a portion between the warp threads 110 and 110 and/or between the weft threads 120 and 120 dominantly includes the resin 140 and thus has a low dielectric constant. Namely, the dielectric constant is greatly changed depending on the portions of the laminated board 190. As described above, the entire straight-line part of the circuit 150 disposed just above the warp thread 110 extends parallel and close to the warp thread 110. Therefore, a transmission rate by use of this circuit 150 as a signal line is affected greatly by the warp thread 110 with the high dielectric constant. In contrast, the entire straight-line part of the circuit 150 disposed above the space between the warp threads 110 is far from the warp threads 110, and therefore is more likely to be affected by the close resin 140. Hence, when this circuit 150 is used as a signal line, the transmission rate is affected greatly by the resin 140 with the low dielectric constant.

As described above, when the circuits 150 are provided parallel to the warp threads 110, a problem occurs that a difference occurs between the signal transmission rates of the circuit 150 extending along and just above the warp threads 110 and the circuit 150 extending along and above the space between the warp threads 110 and 110. A similar problem occurs in the circuits 150 provided parallel to the weft threads 120. When the circuits 150 are provided parallel to the weft threads 120, this would cause a problem that a difference between signal transmission rates of the circuit 150 extending just above and along the weft threads 120 and the circuit 150 extending along and above the space between the weft threads 120 and 120.

In particular, differential transmission can reduce signal amplitude compared with single ended transmission, and thus the differential transmission can increase a data transmission rate. The differential transmission is a method of transmitting data using paired signal lines. Accordingly, it is important to reduce a difference between the transmission rates.

In this regard, in Patent Document 1, when used is cloth composed of warp and weft threads made of glass fiber bundles, the fiber bundles of the warp and weft threads are subjected to opening treatment so as to be flat, in order to reduce gaps between the warp threads and between the weft threads. In this way, when the gaps between the warp threads and between the weft threads are reduced, the amount of the resin present in the gaps decreases, and therefore uneven distribution of the warp threads, the weft threads, and the resin decreases. Hence, if the circuits are provided parallel to the warp threads or the weft threads and some of the circuits extending just above and along the warp threads or the weft threads and the others are extending above and along the space between the warp threads or between the weft threads, it is possible to reduce the unevenness of the dielectric constants that affects the signal transmission rates of these circuits.

However, in this case, uneven distribution of the warp threads, the weft threads, and the resin cannot be small enough, and an effect for reducing the unevenness of the dielectric constant that affects the signal transmission rates of these circuits, is not provided so as to be expected. Besides, in Patent Document 1, high-pressure water jet or the like is required for the opening treatment, and therefore there is a problem that production equipment is required.

In this regard, in order to solve the above problem caused by that the circuits 150 are provided parallel to the warp threads 110 or the weft threads 120 of the cloth 130, there has been proposed to prepare the printed wiring board 200 by positioning the printed wiring board 200 oblique to the laminated board 190 as shown in FIG. 6C. Namely, the printed wiring board 200 is prepared to be oblique to the laminated board 190 by forming the circuits 150 on the face of the laminated board 190 in such a manner that the straight-line parts 151 of the circuits 150 are not parallel but oblique at about 10 degrees to the side edge "e" along the longitudinal direction of the laminated board 190 and the straight-line parts 152 of the circuits 150 are not orthogonal but oblique at about 10 degrees to the side edge "e" along the longitudinal direction of the laminated board 190.

In this way, when the straight-line parts 151 and 152 of the circuits 150 are formed so as to be oblique to the side edge "e", the straight-line part 151 of the circuit 150 is not parallel to the warp threads 110 of the cloth 130, and the straight-line part 151 of the circuit 150 extends across the warp threads 110 and the space between the adjacent warp threads 110 and 110 in turn. Similarly, the straight-line part 152 of the circuit 150 is not parallel to the weft threads 120 of the cloth 130, and the straight-line part 152 of the circuit 150 extends across the weft threads 120 and the space between the adjacent weft threads 120 and 120 in turn. Accordingly, the straight-line parts 151 and 152 of the circuit 150 are to be affected by both of the resin 140 with the low dielectric constant and the warp threads 110 or the weft threads 120 with the high dielectric constant in a similar way. Since the case is less likely to occur where some of the circuits 150 are affected by the warp threads 110 or the weft threads 120 with the high dielectric constant and the others of the circuits 150 are affected by the resin 140 with the low dielectric constant, the difference between the dielectric constants is less likely to affect the signal transmission rates, and it is possible to prevent occurrence of the difference between the signal transmission rates with using the circuits 150.

However, when the circuits 150 are formed so as to be oblique to the laminated board 190 on the face thereof as shown in FIG. 6C, degree of freedom in patterning wire for the circuit 150 is reduced, and therefore a problem may occur that it is difficult to increase a wiring density. Besides, since the printed wiring board 200 is prepared so as to be oblique to the laminated board 190, with regard to a process of forming a plurality of printed wiring boards 200 from a single laminated board 190, a problem may occur that an efficiency of forming the plurality of printed wiring boards 200 from the single laminated board 190 decreases, for example, and the blank area increases.

CITATION LIST

Patent Literature

Patent Literature 1: JP 1996-127959 A

SUMMARY OF INVENTION

Technical Problem

The present invention has been made in order to solve the above-mentioned problems, and an object thereof is to provide a printed wiring board which does not require arranging signal lines oblique to the warp or weft threads constituting a substrate and is capable of reducing a difference in transmission rates between the signal lines.

Solution to Problem

A printed wiring board in accordance with the present invention includes: an insulating layer; and a signal layer including a set of at least two signal lines and disposed on one side of the insulating layer. The insulating layer is provided with a substrate embedded inside the insulating layer in such a manner to be further from the signal layer than a center of the insulating layer in a thickness direction of the insulating layer is. The insulating layer has a laminated structure of a thick layer, the substrate, and a thin layer. The thick layer is positioned on a side of the substrate over which the signal layer is provided. The thin layer is positioned on an opposite side of the substrate from the side over which the signal layer is provided. A ratio of a thickness of the thick layer to a thickness of the thin layer is greater than five.

A printed wiring board in accordance with the present invention includes: a first insulating layer; and a second insulating layer; and a signal layer including a set of at least two signal lines and interposed between the first insulating layer and the second insulating layer. The first insulating layer is provided with a first substrate embedded inside the first insulating layer in such a manner to be further from the signal layer than a center of the first insulating layer in a thickness direction of the first insulating layer is. The second insulating layer is provided with a second substrate embedded inside the second insulating layer in such a manner to be further from the signal layer than a center of the second insulating layer in a thickness direction of the second insulating layer is.

It is preferable that the printed wiring board further includes: a third insulating layer which is disposed on the first insulating layer and is provided with a third substrate embedded inside the third insulating layer in such a manner to be closer to the signal layer than a center of the third insulating layer in a thickness direction of the third insulating layer is; and a fourth insulating layer which is disposed on the second insulating layer and is provided with a fourth substrate embedded inside the fourth insulating layer in such a manner to be closer to the signal layer than a center of the fourth insulating layer in a thickness direction of the fourth insulating layer is.

It is preferable that in the printed wiring board, the set of the at least two signaling lines of the signal layer includes paired signal lines for differential transmission.

A printed wiring board in accordance with the present invention includes: a first insulating layer; and a first signal layer including a set of at least two signal lines; and a second insulating layer; and a second signal layer including a set of at least two signal lines; and a third insulating layer; and a fourth insulating layer. The first insulating layer, the first signal layer, the second insulating layer, the third insulating layer, the second signal layer, and the fourth insulating layer are stacked in this order. The first insulating layer is provided with a first substrate embedded inside the first insulating layer in such a manner to be further from the first signal layer than a center of the first insulating layer in a thickness direction of the first insulating layer is. The second insulating layer is provided with a second substrate embedded inside the second insulating layer in such a manner to be further from the first signal layer than a center of the second insulating layer in a thickness direction of the second insulating layer is. The third insulating layer is provided with a third substrate embedded inside the third insulating layer in such a manner to be further from the second signal layer than a center of the third insulating layer in a thickness direction of the third insulating layer is. The fourth insulating layer is provided with a fourth substrate embedded inside the fourth insulating layer in such a manner to be further from the second signal layer than a center of the fourth insulating layer in a thickness direction of the fourth insulating layer is.

It is preferable that in the printed wiring board, at least one of the at least two signal lines of the first signal layer and the set of the at least signal lines of the second signal layer includes paired signal lines for differential transmission.

According to the present invention, a signal layer is positioned far from the substrate, and therefore the signal layer is less likely to be affected greatly by a substrate with a high dielectric constant, and signal lines are affected uniformly by resin with a low dielectric constant. Hence, it is possible to provide a printed wiring board which does not require arranging signal lines oblique to the warp or weft threads constituting a substrate, and is capable of reducing a difference in transmission rates between the signal lines extremely.

BRIEF DESCRIPTION OF DRAWINGS

FIG. 6A is a planner view of a conventional prepreg, and FIGS. 6B and 6C are partially enlarged planner views of a printed wiring board.

DESCRIPTION OF EMBODIMENTS

Embodiments in accordance with the present invention will be described below.

Embodiment 1

Figure 1:
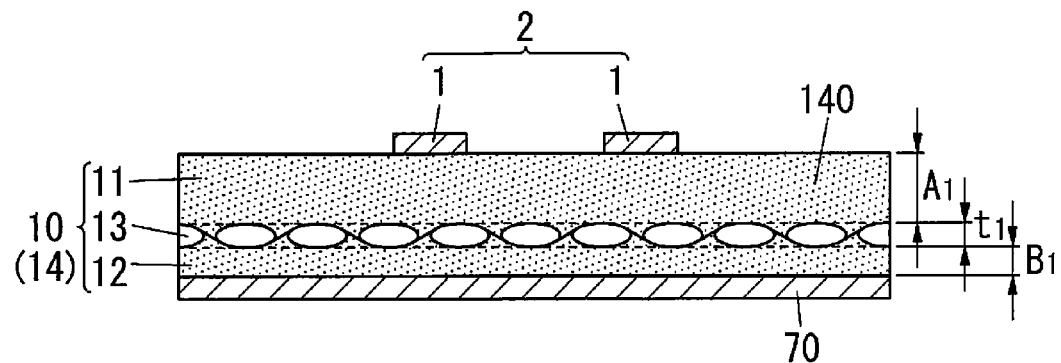
FIG. 1 is a cross-sectional view of an example of an embodiment in accordance with the present invention.

FIG. 1 shows an example of a printed wiring board in accordance with the present invention. The printed wiring board is prepared by forming a signal layer 2 including a set of at least two signal lines 1 on one side of an insulating layer 10, and is specifically prepared as follows.

At first, prepreg 14 including a substrate 13 positioned close to a face of one side thereof is prepared. As the substrate 13, glass cloth prepared by interlacing warp threads and weft threads of glass fibers may be used. The glass cloth with a high dielectric constant may be available. Then, the substrate 13 is impregnated with resin 140 such as thermosetting resin (e.g., epoxy resin), and subsequently amounts of the resin 140 on both sides of the substrate 13 are adjusted by squeezing thus-obtained substrate into an aperture between two squeezing bars (not shown). Here, the amounts are adjusted in such a manner that the resin 140 on the one side of the substrate 13 is reduced by shifting the substrate 13 toward one of the squeezing bars. Thereafter, thus-obtained substrate 13 is heated and dried in such a manner that the resin is in a B-stage state (semi-cured state), and consequently the prepreg 14 including the substrate 13 positioned close to the face of the one side may be prepared. In contrast, in order to prepare the prepreg 14 including the substrate 13 positioned close to the face of the one side of the prepreg 14, a prepreg 14 may be prepared so as to include the substrate 13 at the center in the thickness direction thereof in advance, and subsequently the additional resin 140 may be applied onto a face of one side of this prepreg 14. If the substrate 13 impregnated with the resin 140 is dried through heating with being disposed horizontally, a resin layer on an upper side of the substrate 13 is made thin and a resin layer on a lower side of the substrate 13 is made thick by gravity. In this way, the prepreg 14 including substrate 13 positioned close to the face of the one side of the prepreg 14 may be prepared.

Thereafter, a one-sided metal laminated board is prepared by disposing metal foil such as copper foil for forming the signal layer 2 on a face of an opposite side of the prepreg 14 from the face of the one side close to the substrate 13, and subsequently molding thus-obtained laminate by means of heating and pressing. At this time, a double-sided metal laminated board may be prepared by disposing metal foil on opposite sides of the prepreg 14. The printed wiring board shown in FIG. 1 is formed by use of this double-sided metal laminated board. In thus-obtained one-sided or double-sided metal laminated board, the prepreg 14 is turned into a C-stage state (full-cured state) and formed into the insulating layer 10. The insulating layer 10 has a laminated structure of a thick layer 11, the substrate 13, and a thin layer 12. The thick layer 11 is positioned on a side of the substrate 13 over which the signal layer 2 is provided while the thin layer 12 is positioned on an opposite side of the substrate from the side over which the signal layer 2 is provided. The thickness $A_1$ of the thick layer 11 preferably falls within a range of 10 to 90 μm, the thickness $t_1$ of the substrate 13 preferably falls within a range of 10 to 250 μm, and the thickness $B_1$ of the thin layer 12 preferably falls within a range of 0 to 10 μm. The total thickness $(A_1+t_1+B_1)$ of the insulating layer 10 preferably falls within a range of 20 to 350 μm. Besides, in order to use the resin 140 effectively, a ratio of $A_1$ to $B_1$ is selected to be greater than five. As described above, by increasing the ratio of $A_1$ (the thickness of the thick layer 11) sufficiently, it is possible to suppress an adverse effect on the signal layer 2 caused by a portion of the substrate 13 having a high dielectric constant. Note that since the substrate 13 is formed by interlacing warp threads and weft threads, a face of the substrate 13 itself has a microscopic uneven structure of mesh composed of the warp threads and the weft threads, but in this specification, the aforementioned thicknesses are selected, provided that the face of the substrate 13 itself is defined as a plane made by connecting vertices of the warp threads or the weft threads.

Subsequently, with using a subtractive method or the like, unwanted parts of the metal foil bonded to the thick layer 11 with the great thickness are removed with etching techniques to form the signal layer 2 composed of the set of at least two signal lines 1. Consequently, the printed wiring board as shown in FIG. 1 can be obtained. In this printed wiring board, the substrate 13 is embedded inside the insulating layer 10 in such a manner to be further from the signal layer 2 than a center of the insulating layer 10 in a thickness direction of the insulating layer 10 is. Besides, the signal layer 2 is formed such that the set of the signal lines 1 of the signal layer 2 includes paired signal lines (differential transmission lines) used for transmitting data by means of a differential transmission system. Note that if metal foil 70 is bonded to the thin layer 12 with a small thickness, this metal foil 70 may serve as a ground layer or a power layer with being not related to the transmission rate.

Figure 6A:
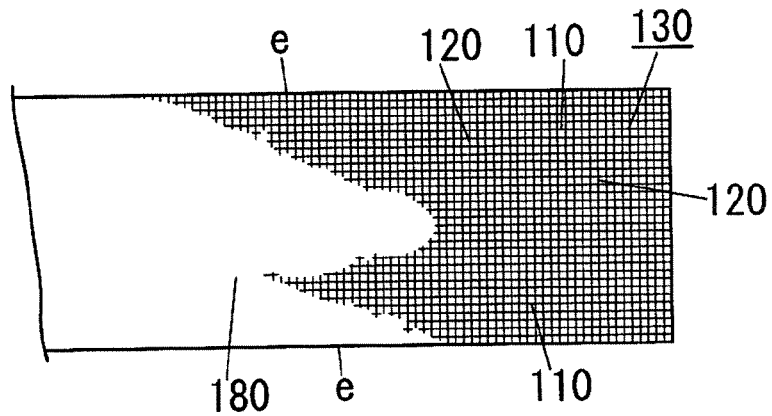
FIGS. 6A to 6C show a prior art.
Figure 6B:
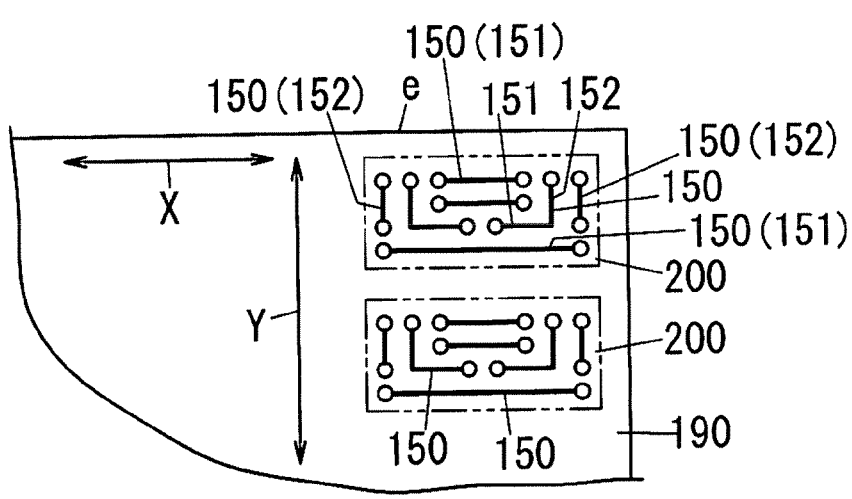
Figure 6C:
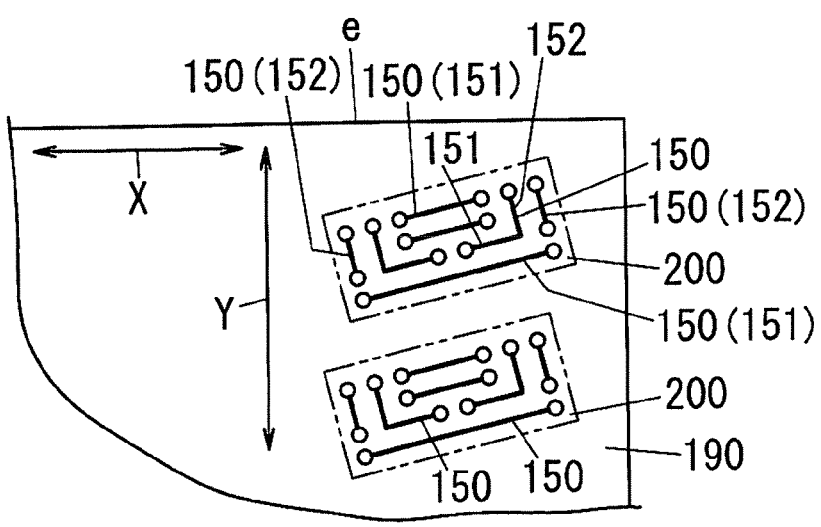
Figure 7:
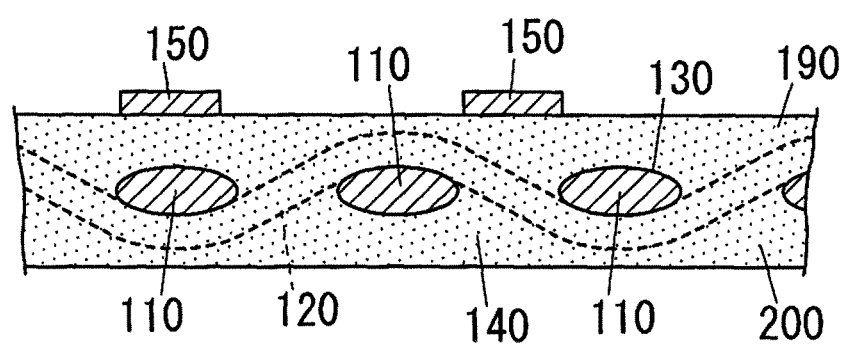
FIG. 7 is an enlarged cross-sectional view of the printed wiring board of the prior art.

In the printed wiring board obtained in the aforementioned manner, the signal layer 2 is positioned far from the substrate 13, so that the signal layer 2 is less likely to be affected by the portion of the substrate 13 with the high dielectric constant and that signal lines 1 are affected uniformly by the resin with the low dielectric constant. Hence, it is possible to make the difference between the transmission rates with using the signal lines 1 extremely small. For example, a differential transmission system transmits signals having different phases by 180 degrees with the paired signal lines 1. When the difference between the transmission rates is extremely small, it is possible to suppress a divergence in phases. Therefore, there may be no need for disposing signal lines 1 oblique to the warp threads or weft threads composing the substrate 13 as shown in FIG. 6C. In contrast, by disposing signal lines 1 parallel to the warp or weft threads composing the substrate 13 as shown in FIG. 6B, it is possible to reduce a blank area, and therefore it is possible to increase efficiency of forming a plurality of printed wiring boards from a single substrate.

Embodiment 2

Figure 2:
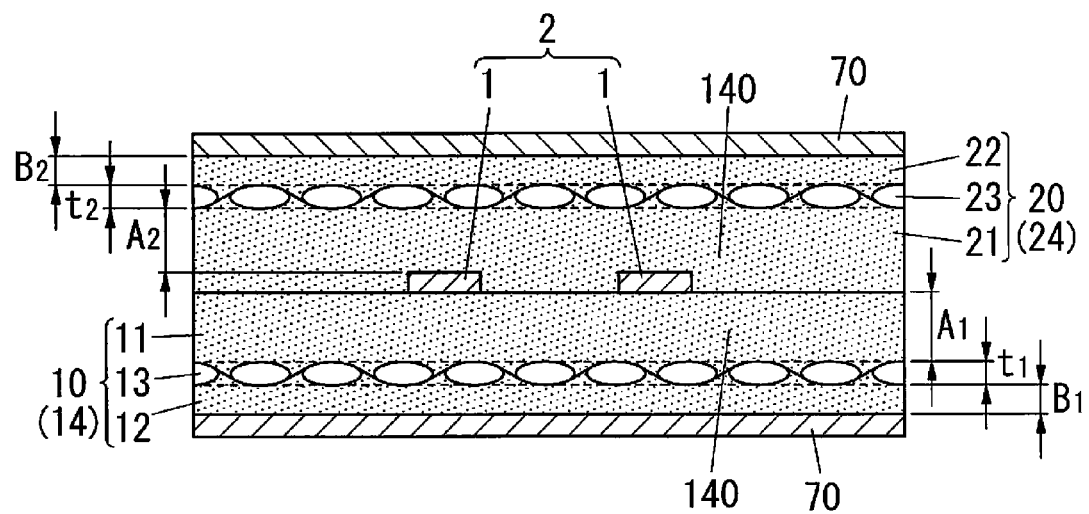
FIG. 2 is a cross-sectional view of an example of an embodiment in accordance with the present invention.

FIG. 2 shows another example of a printed wiring board in accordance with the present invention. The printed wiring board may be prepared by disposing prepreg 24 obtained in the same manner to the aforementioned prepreg 14 on the signal layer 2 of the printed wiring board shown in FIG. 1. For convenience of description, the prepreg 14 also used for manufacture of the printed wiring board shown in FIG. 1 is referred to as a first prepreg 14 (the insulating layer 10, the thick layer 11, and the thin layer 12 are also referred to as a first insulating layer 10, a first thick layer 11, and a first thin layer 12). The prepreg 24 also used for manufacture of the printed wiring board shown in FIG. 2 is referred to as a second prepreg 24. The second insulating layer 20 formed of the second prepreg 24 has a laminated structure of a second thick layer 21 and a second substrate 23 and a second thin layer 22. The second prepreg 24 is disposed on the signal layer 2 of the printed wiring board shown in FIG. 1 in such a manner that the second thick layer 21 faces the signal layer 2. At the time, laminate molding may be performed with metal foil 70 being disposed on the second thin layer 22 with a small thickness.

In thus-obtained printed wiring board, the second prepreg 24 is turned into a C-stage state (full-cured state) and formed into the second insulating layer 20. The thickness $A_2$ (a distance between a face of the second substrate 23 close to the signal layer 2 and a face of the signal layer 2 close to the second substrate 23) of the second thick layer 21 preferably falls within a range of 10 to 90 μm, the thickness $t_2$ of the second substrate 23 preferably falls within a range of 10 to 250 μm, and the thickness $B_2$ of the second thin layer 22 preferably falls within a range of 0 to 10 μm. The total thickness $(A_2+t_2+B_2)$ of the second insulating layer 20 preferably falls within a range of 20 to 350 μm. Besides, in order to use the resin 140 effectively, a ratio of $A_2$ to $B_2$ is preferably five or more, and is more preferably greater than five.

In this printed wiring board, the signal layer 2 is interposed between the first insulating layer 10 and the second insulating layer 20. Besides, the second substrate 23 is embedded inside the second insulating layer 20 in such a manner to be further from the signal layer 2 than a center of the second insulating layer 20 in a thickness direction of the second insulating layer 20 is. Also in this case, the signal layer 2 is formed such that the set of the signal lines 1 of the signal layer 2 include paired lines (differential transmission lines) used for transmitting data by means of a differential transmission system. Note that if metal foil 70 is bonded to the thin layer 12 having the small thickness as shown in FIG. 2, the metal foil 70 may serve as a ground layer or a power layer with being not related to the transmission rate.

Thus-obtained printed wiring board can achieve a similar effect to the printed wiring board shown in FIG. 1. Moreover, it is possible to cover and protect the signal layer 2 with the first insulating layer 10 and the second insulating layer 20 and to make a multi-layered. Furthermore, a warp of the printed wiring board shown in FIG. 2 can be more suppressed compared with the printed wiring board shown in FIG. 1.

Embodiment 3

Figure 3A:
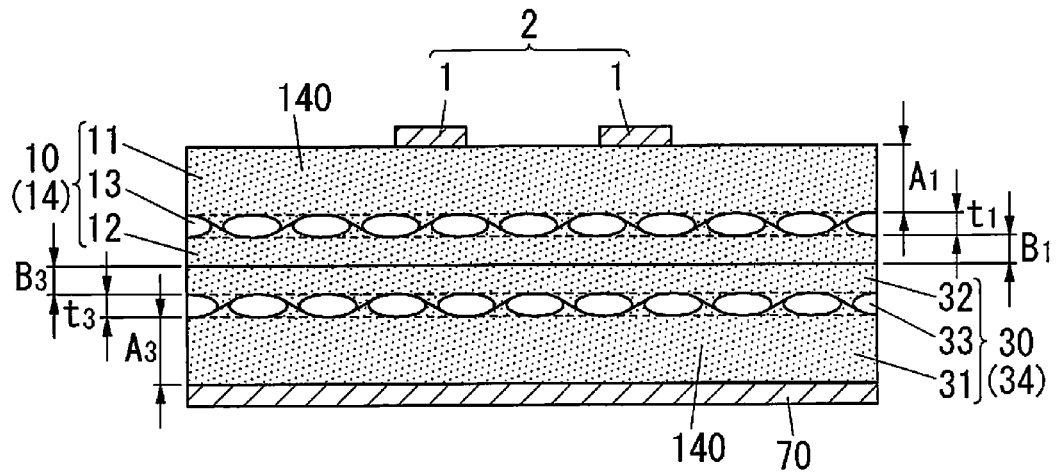
FIGS. 3A and 3B are cross-sectional views of examples of an embodiment in accordance with the present invention.
Figure 3B:
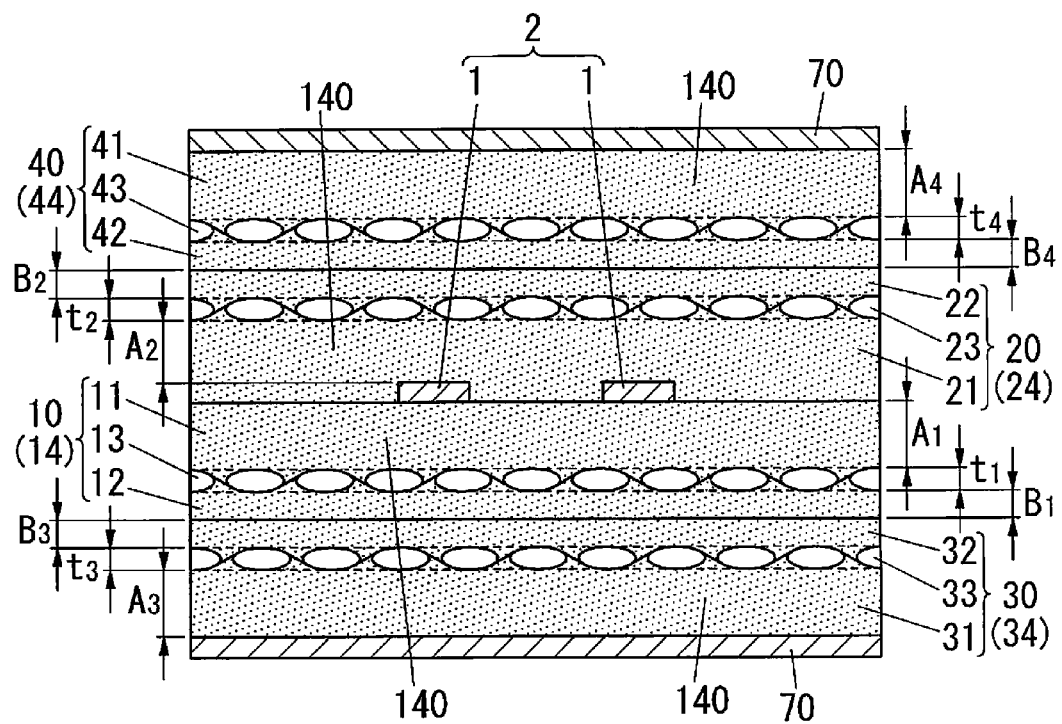

FIGS. 3A and 3B show other examples of printed wiring boards in accordance with the present invention. The printed wiring board shown in FIG. 3B may be formed by use of the printed wiring board shown in FIG. 3A. The printed wiring boards shown in FIGS. 3A and 3B may be formed by use of a third prepreg 34 and a fourth prepreg 44 prepared in a similar manner to the first prepreg 14 and the second prepreg 24.

First, a one-sided metal laminated board is prepared by disposing metal foil such as copper foil for forming a signal layer 2 on a face of an opposite side of a first prepreg 14 from a face of a side of the first prepreg 14 close to a first substrate 13, and arranging the first prepreg 14 and the third prepreg 34 such that a face (namely, a third thin layer 32) on a side of the third prepreg 34 close to a third substrate 33 faces the face (namely, a first thin layer 12) of the side of the first prepreg 14 close to the first substrate 13, and subsequently molding thus-obtained laminate by means of heating and pressing. At this time, a double-sided metal laminated board may be prepared by disposing metal foil on a third thick layer 31 of the third prepreg 34. The printed wiring board shown in FIG. 3A is formed with using the double-sided metal laminated board. The printed wiring board shown in FIG. 3A is formed by use of this double-sided metal laminated board. In thus-obtained one-sided or double-sided metal laminated board, the first prepreg 14 and the third prepreg 34 are turned into a C-stage state (full-cured state) and formed into a first insulating layer 10 and a third insulating layer 30, respectively. The thickness $A_1$ of the first thick layer 11 preferably falls within a range of 10 to 90 μm. The thickness $A_3$ of the third thick layer 31 preferably falls within a range of 10 to 90 μm. The thickness $t_1$ of the first substrate 13 preferably falls within a range of 10 to 250 μm. The thickness $t_3$ of the third substrate 33 preferably falls within a range of 10 to 250 μm. The thickness $B_1$ of the first thin layer 12 preferably falls within a range of 0 to 10 μm. The thickness $B_3$ of the third thin layer 32 preferably falls within a range of 0 to 10 μm. The total thickness $(A_1+t_1+B_1)$ of the first insulating layer 10 preferably falls within a range of 20 to 350 μm. The total thickness $(A_3+t_3+B_3)$ of the third insulating layer 30 preferably falls within a range of 20 to 350 μm. Besides, in order to use resin 140 effectively, a ratio of $A_1$ to $B_1$ and a ratio of $A_3$ to $B_3$ are preferably five or more, and more preferably greater than five.

Subsequently, with using a subtractive method or the like, unwanted parts of the metal foil bonded to the first thick layer 11 with the great thickness are removed with etching techniques to form the signal layer 2 composed of a set of at least two signal lines 1. Consequently, the printed wiring board as shown in FIG. 3A can be obtained. In this printed wiring board, the third insulating layer 30 is disposed on the first insulating layer 10. The first substrate 13 is embedded inside the first insulating layer 10 in such a manner to be further from the signal layer 2 than a center of the first insulating layer 10 in a thickness direction of the first insulating layer 10 is. The third substrate 33 is embedded inside the third insulating layer 30 in such a manner to be nearer from the signal layer 2 than a center of the third insulating layer 30 in a thickness direction of the third insulating layer 30 is.

The printed wiring board shown in FIG. 3B is prepared by stacking the second prepreg 24 and the fourth prepreg 44 in this order, on the signal layer 2 of the printed wiring board shown in FIG. 3A. At the preparation, laminate molding may be performed with metal foil 70 being disposed on a fourth thick layer 41 with a great thickness of the fourth prepreg 44 as shown in FIG. 3B.

In thus-obtained printed wiring board, the second prepreg 24 and the fourth prepreg 44 are turned into a C-stage state (full-cured state) and formed into a second insulating layer 20 and a fourth insulating layer 40, respectively. The thickness $A_2$ (a distance between a face of the second substrate 23 close to the signal layer 2 and a face of the signal layer 2 close to the second substrate 23) of the second thick layer 21 preferably falls within a range of 10 to 90 μm. The thickness $A_4$ of the fourth thick layer 41 preferably falls within a range of 10 to 90 μm. The thickness $t_2$ of a second substrate 23 preferably falls within a range of 10 to 250 μm. The thickness $t_4$ of a fourth substrate 43 preferably falls within a range of 10 to 250 μm. The thickness $B_2$ of a second thin layer 22 preferably falls within a range of 0 to 10 μm. The thickness $B_4$ of a fourth thin layer 42 preferably falls within a range of 0 to 10 μm. The total thickness ($A_2+t_2+B_2$) of the second insulating layer 20 preferably falls within a range of 20 to 350 μm. The total thickness ($A_4+t_4+B_4$) of the fourth insulating layer 40 preferably falls within a range of 20 to 350 μm. Besides, in order to use resin 140 effectively, a ratio of $A_2$ to $B_2$ and a ratio of $A_4$ to $B_4$ are preferably five or more, and more preferably greater than five.

In the printed wiring board shown in FIG. 3B, the second insulating layer 20 is disposed on the fourth insulating layer 40. The second substrate 23 is embedded inside the second insulating layer 20 in such a manner to be further from the signal layer 2 than a center of the second insulating layer 20 in a thickness direction of the second insulating layer 20 is. The fourth substrate 43 is embedded inside the fourth insulating layer 40 in such a manner to be nearer from the signal layer 2 than a center of the fourth insulating layer 40 in a thickness direction of the fourth insulating layer 40 is. Also, in this case, the signal layer 2 is formed such that the set of signal lines 1 of the signal layer 2 include paired signal lines (differential transmission lines) used for transmitting data by means of a differential transmission system. Note that if metal foil 70 is bonded to each of the third thick layer 31 and fourth thick layer 41, the metal foil 70 may serve as a ground layer or a power layer with being not related to the transmission rate.

Thus-obtained printed wiring board can achieve a similar effect to the printed wiring board shown in FIG. 2. Furthermore, a warp of the printed wiring board shown in FIG. 3B can be more suppressed compared with the printed wiring boards shown in FIGS. 1 and 2.

Embodiment 4

Figure 4A:
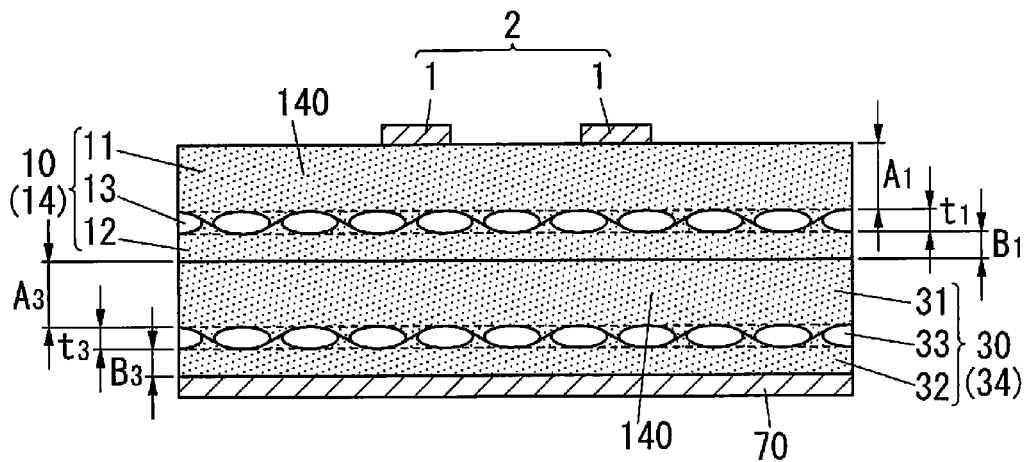
FIGS. 4A and 4B are cross-sectional views of examples of an embodiment in accordance with the present invention.
Figure 4B:
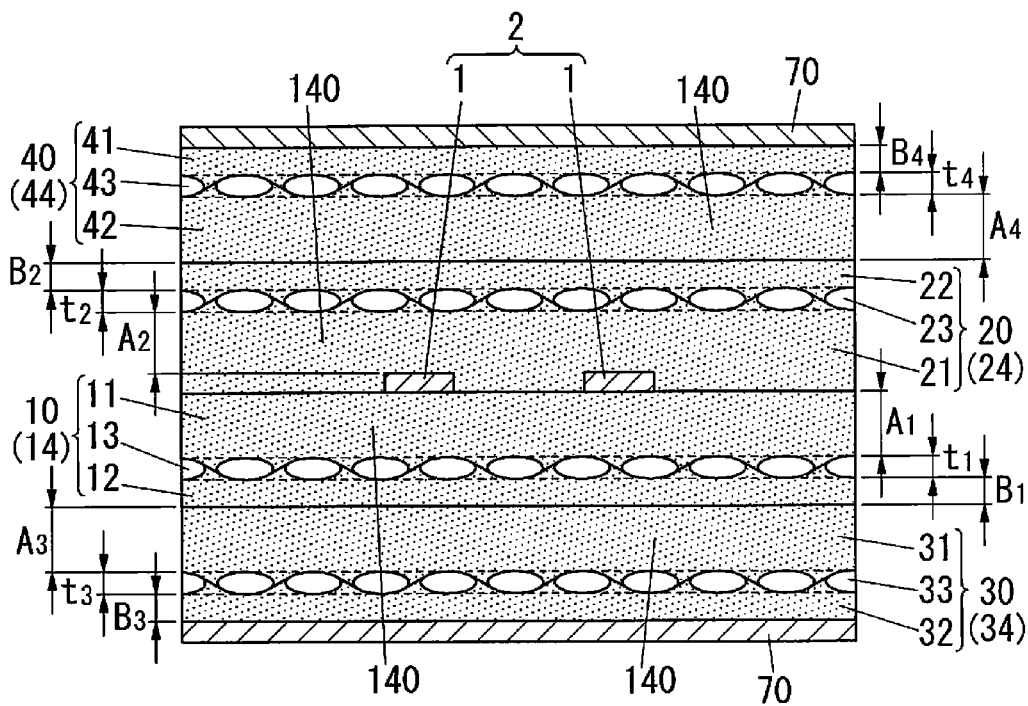

FIGS. 4A and 4B show other examples of printed wiring boards in accordance with the present invention. The printed wiring board shown in FIG. 4B may be formed by use of the printed wiring board shown in FIG. 4A. The printed wiring board shown in FIG. 4B is manufactured with a method for the printed wiring board shown in FIG. 3B except that the third prepreg 34 and the fourth prepreg 44 are reversed respectively. Namely, the printed wiring board shown in FIG. 4B is different from the printed wiring board shown in FIG. 3B in that the third thick layer 31 and the third thin layer 32 of the third insulating layer 30 are interchanged and the fourth thick layer 41 and the fourth thin layer 42 of the fourth insulating layer 40 are interchanged.

Thus-obtained printed wiring board can achieve a similar effect to the printed wiring board shown in FIG. 2. Furthermore, a warp of the printed wiring board shown in FIG. 4B can be more suppressed compared with the printed wiring boards shown in FIGS. 1 and 2. Note that a warp of the printed wiring board shown in FIG. 3B can be more suppressed compared with the printed wiring board shown in FIG. 4B.

Embodiment 5

Figure 5A:
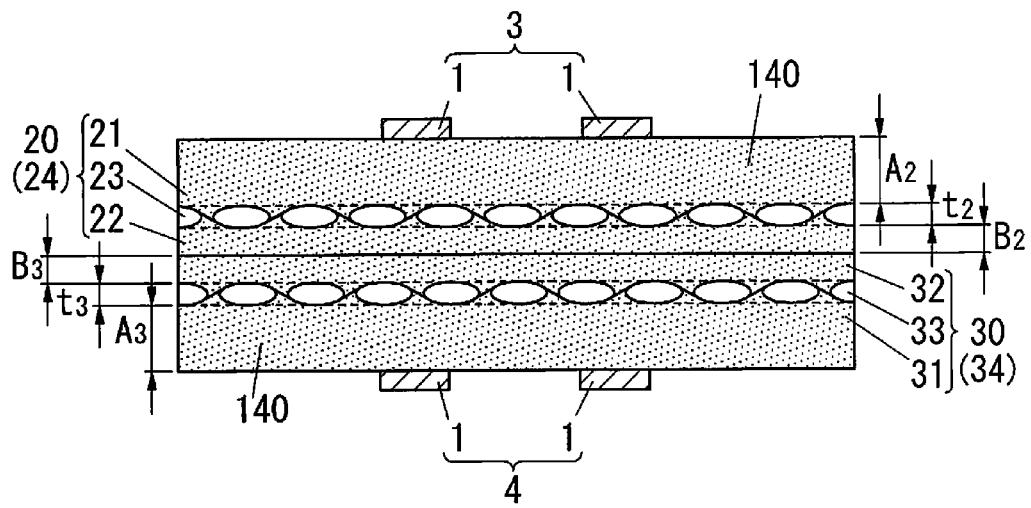
FIGS. 5A and 5B are cross-sectional views of examples of an embodiment in accordance with the present invention.
Figure 5B:
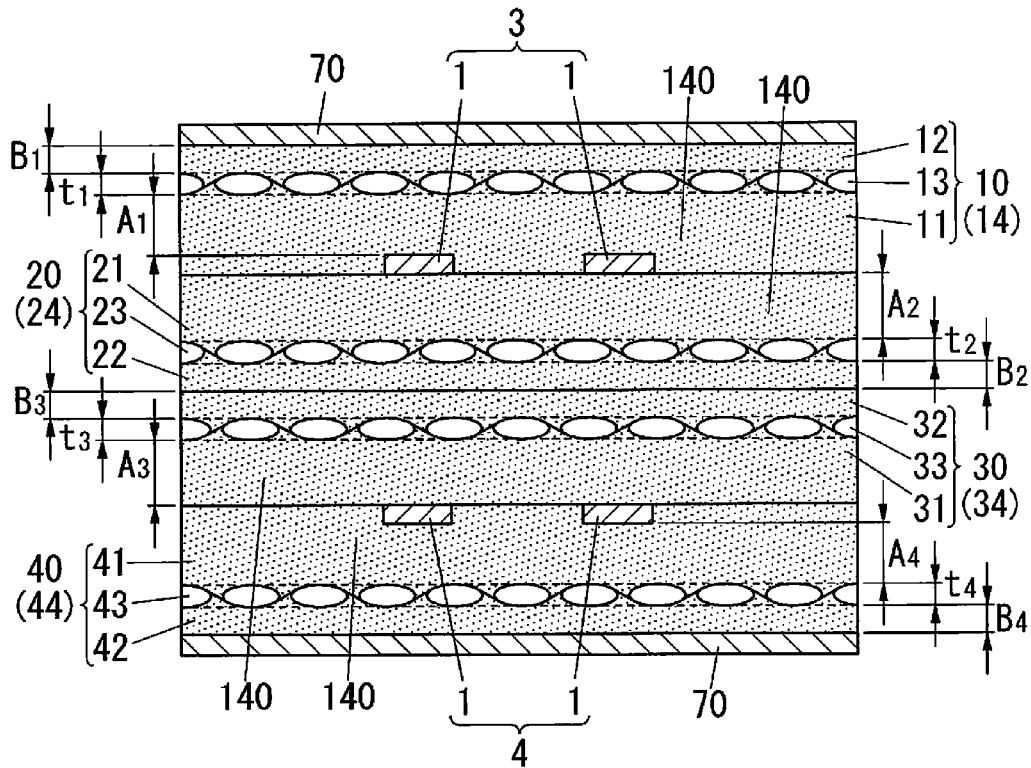

FIGS. 5A and 5B show other examples of printed wiring boards in accordance with the present invention. The printed wiring board shown in FIG. 5B may be formed by use of the printed wiring board shown in FIG. 5A. The printed wiring board shown in FIG. 5B is prepared by stacking a first insulating layer 10, a first signal layer 3, a second insulating layer 20, a third insulating layer 30, a second signal layer 4, and a fourth insulating layer 40 in this order, and can be formed with using the printed wiring board shown in FIG. 5A. The printed wiring boards shown in FIGS. 5A and 5B are formed with using a first prepreg 14, a second prepreg 24, a third prepreg 34, and a fourth prepreg 44.

First, a double-sided metal laminated board is prepared by disposing metal foil such as copper foil for forming the first signal layer 3 on a face (namely, a second thick layer 21) of an opposite side of the second prepreg 24 from a face of a side of the second prepreg 24 close to a first substrate 13, and arranging the second prepreg 24 and the third prepreg 34 such that a face (namely, a second thin layer 22) of a side of the second prepreg 24 close to a second substrate 23 faces a face (namely, a third thin layer 32) of a side of the third prepreg 34 close to a third substrate 33, and disposing metal foil such as copper foil for forming the second signal layer 4 on a face (namely, a third thick layer 31) of an opposite side of the third prepreg 34 from a face of a side of the third prepreg 34 close to the third substrate 33, and subsequently molding thus-obtained laminate by means of heating and pressing. In thus-obtained double-sided metal laminated board, the second prepreg 24 and the third prepreg 34 are turned into a C-stage state (full-cured state) and formed into the second insulating layer 20 and the third insulating layer 30, respectively. The thickness $A_2$ of the second thick layer 21 preferably falls within a range of 10 to 90 μm. The thickness $A_3$ of the third thick layer 31 preferably falls within a range of 10 to 90 μm. The thickness $t_2$ of the second substrate 23 preferably falls within a range of 10 to 250 μm. The thickness $t_3$ of the third substrate 33 preferably falls within a range of 10 to 250 μm. The thickness $B_2$ of the second thin layer 22 preferably falls within a range of 0 to 10 μm. The thickness $B_3$ of the third thin layer 32 preferably falls within a range of 0 to 10 μm. The total thickness ($A_2+t_2+B_2$) of the second insulating layer 20 preferably falls within a range of 20 to 350 μm. The total thickness ($A_3+t_3+B_3$) of the third insulating layer 30 preferably falls within a range of 20 to 350 μm. Besides, in order to use resin 140 effectively, a ratio of $A_2$ to $B_2$ and a ratio of $A_3$ to $B_3$ are preferably five or more, and more preferably greater than five.

Subsequently, with using a subtractive method or the like, unwanted parts of the metal foil bonded to the second thick layer 21 with the great thickness are removed with etching techniques to form the first signal layer 3 including the set of the at least two signal lines 1. And, unwanted parts of the metal foil bonded to the third thick layer 31 with the great thickness are removed with etching techniques to form the second signal layer 4 including the set of the at least two signal lines 1. Consequently, the printed wiring board as shown in FIG. 5A can be obtained. In this printed wiring board, the second insulating layer 20 and the third insulating layer 30 are stacked. The second substrate 23 is embedded inside the second insulating layer 20 in such a manner to be further from the first signal layer 3 than a center of the second insulating layer 20 in a thickness direction of the second insulating layer 20 is. The third substrate 33 is embedded inside the third insulating layer 30 in such a manner to be further from the second signal layer 4 than a center of the third insulating layer 30 in a thickness direction of the third insulating layer 30 is. Besides, at least one of the set of the at least two signal lines 1 of the first signal layer 3 and the set of the at least two signal lines 1 of the second signal layer 4 includes paired signal lines (differential transmission lines) used for transmitting data by means of a differential transmission system.

The printed wiring board shown in FIG. 5B is prepared by disposing the first prepreg 14 on the printed wiring board shown in FIG. 5A and disposing the fourth prepreg 44 on the second signal layer 4 and subsequently molding thus-obtained laminate by means of heating and pressing. At molding, metal foil 70 may be disposed on each of first thin layer 12 with a small thickness of the first prepreg 14 and the fourth thin layer 42 with a small thickness of the fourth prepreg 44 as shown in FIG. 5B.

In thus-obtained printed wiring board, the first prepreg 14 and the fourth prepreg 44 are turned into a C-stage state (full-cured state) and formed into a first insulating layer 10 and the fourth insulating layer 40, respectively. The thickness $A_1$ (a distance between a face of the first substrate 13 close to the first signal layer 3 and a face of the first signal layer 3 close to the first substrate 13) of the first thick layer 11 preferably falls within a range of 10 to 90 μm. The thickness $A_4$ (a distance between a face of the fourth substrate 43 close to the second signal layer 4 and a face of the second signal layer 4 close to the fourth substrate 43) of the fourth thick layer 41 preferably falls within a range of 10 to 90 μm. The thickness $t_1$ of the first substrate 13 preferably falls within a range of 10 to 250 μm. The thickness $t_4$ of the fourth substrate 43 preferably falls within a range of 10 to 250 μm. The thickness $B_1$ of the first thin layer 12 preferably falls within a range of 0 to 10 μm. The thickness $B_4$ of the fourth thin layer 42 preferably falls within a range of 0 to 10 μm. The total thickness ($A_1+t_1+B_1$) of the first insulating layer 10 preferably falls within a range of 20 to 350 μm. The total thickness ($A_4+t_4+B_4$) of the fourth insulating layer 40 preferably falls within a range of 20 to 350 μm. Besides, in order to use resin 140 effectively, a ratio of $A_1$ to $B_1$ and a ratio of $A_4$ to $B_4$ are preferably five or more, and more preferably greater than five.

In the printed wiring board as shown in FIG. 5B, the first insulating layer 10 is disposed on the second insulating layer 20, and the third insulating layer 30 is disposed on the fourth insulating layer 40. The first substrate 13 is embedded inside the first insulating layer 10 in such a manner to be further from the first signal layer 3 than a center of the first insulating layer 10 in a thickness direction of the first insulating layer 10 is. The fourth substrate 43 is embedded inside the fourth insulating layer 40 in such a manner to be further from the second signal layer 4 than a center of the fourth insulating layer 40 in a thickness direction of the fourth insulating layer 40 is. Also in this case, at least one of the set of the at least two signal lines 1 of the first signal layer 3 and the set of the at least two signal lines 1 of the second signal layer 4 may include paired signal lines (differential transmission lines) used for transmitting data by means of a differential transmission system. Note that if metal foil 70 is bonded to each of the first thin layer 12 and the fourth thin layer 42 as shown in FIG. 5B, the metal foil 70 may serve as a ground layer or a power layer with being not related to the transmission rate.

Thus-obtained printed wiring board can achieve a similar effect to the printed wiring board shown in FIG. 2. Namely, the first signal layer 3 is positioned far from both of the first substrate 13 and the second substrate 23, and the second signal layer 4 is positioned far from both of the third substrate 33 and the fourth substrate 43. Hence, the first signal layer 3 is less likely to be affected by parts having a high dielectric constant of both of the first substrate 13 and the second substrate 23. Moreover, the second signal layer 4 is less likely to be affected by parts having a high dielectric constant of both of the third substrate 33 and the fourth substrate 43, and the signal lines 1 are affected uniformly by resin 140 having a low dielectric constant. Therefore, it is possible to extremely decrease a difference between the transmission rates of the signal lines 1. Furthermore, a warp of the printed wiring board shown in FIG. 5B can be more suppressed compared with the printed wiring boards shown in FIGS. 1 and 2.

EXAMPLES

The present invention will be described specifically with Examples.

Example 1 and Comparative Examples 1 and 2

Glass cloth ("#2166" available from Nitto Boseki Co., Ltd., the thickness of 94 μm) was used as a first substrate 13. A first prepreg 14 (the resin content of 52 mass %) in which the first substrate 13 was positioned close to a face of one side thereof was prepared by impregnating the first substrate 13 with resin 140 (epoxy resin), and subsequently squeezing thus-obtained substrate into an aperture between two squeezing bars with the substrate being shifted toward one of the squeezing bars, and thereafter heating and drying the resulting substrate to be in a B-stage state (semi-cured state).

Thereafter, a double-sided copper laminated board was prepared by disposing copper foil (the thickness of 12 μm) on opposite faces of the first prepreg 14, and subsequently molding thus-obtained laminate by means of heating and pressing. In thus-obtained double-sided metal laminated board, the first prepreg 14 was formed into a first insulating layer 10, and the first insulating layer 10 includes a laminated structure of a first thick layer 11, the first substrate 13, and a first thin layer 12. Table 1 shows a thickness $A_1$ of the first thick layer 11, a thickness $t_1$ of the first substrate 13, and a thickness $B_1$ of the first thin layer 12. Note that a thick layer typically means a layer with a great thickness, and a thin layer typically means a layer with a small thickness. However, in Comparative Example 2, the thickness $A_1$ of the first thick layer 11 is small, that is, 1 μm, and the thickness $B_1$ of the first thin layer 12 is great, that is, 19 μm, for example. Therefore, in the following, the thick layer is not necessarily a layer with a great thickness, but simply means a layer defining a side of the insulating layer on which the signal layer is to be provided. Besides, in the following, the thin layer is not necessarily a layer with a small thickness, but simply means a layer defining an opposite side of the insulating layer from the side on which the signal layer is to be provided.

Subsequently, with using a subtractive method, unwanted parts of the copper foil bonded to the first thick layer 11 were removed with etching techniques to form the signal layer 2 composed of ten signal lines 1 (the width of 140 μm, the length of 10 cm, and the interval between the signal lines of 30 mm). Consequently, a printed wiring board (two-layered circuit board) as shown in FIG. 1 was obtained.

Examples 2 and 3, and Comparative Example 3

Glass cloth ("#2166" available from Nitto Boseki Co., Ltd., the thickness of 94 μm) was used as a second substrate 23. A second prepreg 24 (the resin content of 56 mass %) in which the second substrate 23 was positioned close to a face of one side thereof was prepared by impregnating the second substrate 23 with resin 140 (epoxy resin), and subsequently squeezing thus-obtained substrate into an aperture between two squeezing bars with the substrate being shifted toward one of the squeezing bars, and thereafter heating and drying the resulting substrate to be in a B-stage state (semi-cured state).

Subsequently, the second prepreg 24 and copper foil (the thickness of 12 μm) were stacked in this order on the signal layer 2 of the printed wiring board (two-layered circuit board) shown in the FIG. 1, and subsequently thus-obtained board was molded by means of heating and pressing. Consequently, a printed wiring board (three-layered circuit board) shown in FIG. 2 was obtained.

In thus-obtained printed wiring board (three-layered circuit board), the second prepreg 24 was formed into a second insulating layer 20, and the second insulating layer 20 includes a laminated structure of a second thick layer 21, the second substrate 23, and a second thin layer 22. Table 1 shows a thickness $A_2$ of the second thick layer 21, a thickness $t_2$ of the second substrate 23, and a thickness $B_2$ of the second thin layer 22.

Comparative Example 4

A printed wiring board (two-layered circuit board) with a structure similar to that shown in FIG. 1 was obtained in a similar manner to Example 1 except that a first substrate 13 is positioned at a center of a first prepreg 14 (the resin content of 52 mass %) in a thickness direction of the first prepreg 14.

Example 4

Glass cloth ("#1035" available from Nitto Boseki Co., Ltd., the thickness of 28 μm) was used as a first substrate 13. A first prepreg 14 (the resin content of 71 mass %) in which the first substrate 13 was positioned close to a face of one side thereof was prepared by impregnating the first substrate 13 with resin 140 (epoxy resin), and subsequently squeezing thus-obtained substrate into an aperture between two squeezing bars with the substrate being shifted toward one of the squeezing bars, and thereafter heating and drying the resulting substrate to be in a B-stage state (semi-cured state). A second prepreg 24, a third prepreg 34, and a fourth prepreg 44 were prepared in the same manner to the first prepreg 14.

Thereafter, a double-sided copper laminated board was prepared by disposing copper foil (the thickness of 12 μm) on a first thick layer 11 of the first prepreg 14, and disposing copper foil (the thickness of 12 μm) on a third thick layer 31 of the third prepreg 34, and subsequently molding thus-obtained laminate by means of heating and pressing. In thus-obtained double-sided metal laminated board, the first prepreg 14 was formed into a first insulating layer 10, and the first insulating layer 10 includes a laminated structure of the first thick layer 11, the first substrate 13, and a first thin layer 12. Moreover, the third prepreg 34 was formed into a third insulating layer 30, and the third insulating layer 30 includes a laminated structure of the third thick layer 31, a third substrate 33, and a third thin layer 32. Table 1 shows a thickness $A_1$ of the first thick layer 11, a thickness $t_1$ of the first substrate 13, a thickness $B_1$ of the first thin layer 12, a thickness $A_3$ of the third thick layer 31, a thickness $t_3$ of the third substrate 33, and a thickness $B_3$ of the third thin layer 32.

Subsequently, with using a subtractive method, unwanted parts of the copper foil bonded to the first thick layer 11 were removed with etching techniques to form the signal layer 2 composed of ten signal lines 1 (the width of 140 μm, the length of 10 cm, and the interval between the signal lines of 30 mm). Consequently, a printed wiring board (two-layered circuit board) as shown in FIG. 3A was obtained.

Thereafter, a printed wiring board (three-layered circuit board) as shown in FIG. 3B was obtained by stacking the second prepreg 24, the fourth prepreg 44, and metal foil (the thickness of 12 μm) in this order on a signal layer 2 of the printed wiring board (two-layered circuit board) as shown in FIG. 3A, and subsequently molding thus-obtained board by means of heating and pressing.

In thus-obtained printed wiring board (three-layered circuit board), the second prepreg 24 was formed into a second insulating layer 20, and the second insulating layer 20 includes a laminated structure of a second thick layer 21, a second substrate 23, and a second thin layer 22. Moreover, the fourth prepreg 44 was formed into a fourth insulating layer 40, and the fourth insulating layer 40 includes a laminated structure of a fourth thick layer 41, a fourth substrate 43, and a fourth thin layer 42. Table 1 shows a thickness $A_2$ of the second thick layer 21, a thickness $t_2$ of the second substrate 23, a thickness $B_2$ of the second thin layer 22, a thickness $A_4$ of the fourth thick layer 41, a thickness $t_4$ of the fourth substrate 43, and a thickness $B_4$ of the fourth thin layer 42.

Comparative Example 5

A printed wiring board (two-layered circuit board) with a structure similar to that shown in FIG. 1 was obtained in the same manner as Example 4 except that: a first substrate 13 was positioned at a center of a first prepreg 14 (the resin content of 71 mass %) in a thickness direction of the first prepreg 14; and a second substrate 23 was positioned at a center of a second prepreg 24 (the resin content of 71 mass %) in a thickness direction of the second prepreg 24; and a third substrate 33 was positioned at a center of a third prepreg 34 (the resin content of 71 mass %) in a thickness direction of the third prepreg 34; and a fourth substrate 43 was positioned at a center of a fourth prepreg 44 (the resin content of 71 mass %) in a thickness direction of the fourth prepreg 44.

Example 5

A printed wiring board (two-layered circuit board) as shown in FIG. 4A was obtained in the same manner as Example 4 except that a third prepreg 34 and a fourth prepreg 44 are reversed, respectively. Thereafter, a printed wiring board (three-layered circuit board) as shown in FIG. 4B was obtained Example 6

Glass cloth ("#2166" available from Nitto Boseki Co., Ltd., the thickness of 94 μm) was used as a first substrate 13. A first prepreg 14 (the resin content of 52 mass %) in which the first substrate 13 was positioned close to a face of one side thereof was prepared by impregnating the first substrate 13 with resin 140 (epoxy resin), and subsequently squeezing thus-obtained substrate into an aperture between two squeezing bars with the substrate being shifted toward one of the squeezing bars, and thereafter heating and drying the resulting substrate to be in a B-stage state (semi-cured state). A second prepreg 24, a third prepreg 34, and a fourth prepreg 44 are prepared in the same manner as that for the first prepreg 14.

Thereafter, a double-sided copper laminated board was prepared by: disposing copper foil (the thickness of 12 μm) on a face of a first thick layer 11; and disposing a third thin layer 32 of the third prepreg 34 on a second thin layer 22 of the second prepreg 24; and copper foil (the thickness of 12 μm) on a face of a third thick layer 31 of the third prepreg 34; and subsequently molding thus-obtained laminate by means of heating and pressing. In thus-obtained double-sided metal laminated board, the second prepreg 24 was formed into a second insulating layer 20, and the second insulating layer 20 includes a laminated structure of a second thick layer 21, a second substrate 23, and the second thin layer 22. The third prepreg 34 was formed into a third insulating layer 30, and the third insulating layer 30 includes a laminated structure of the third thick layer 31, the third substrate 33, and the third thin layer 32. Table 1 shows a thickness $A_2$ of the second thick layer 21, a thickness $t_2$ of the second substrate 23, a thickness $B_2$ of the second thin layer 22, a thickness $A_3$ of the third thick layer 31, a thickness $t_3$ of the third substrate 33, and a thickness $B_3$ of the third thin layer 32.

Subsequently, with using a subtractive method, unwanted parts of the copper foil bonded to the second thick layer 21 were removed with etching techniques to form the first signal layer 3 composed of ten signal lines 1 (the width of 140 μm, the length of 10 cm, and the interval between the signal lines of 30 mm). In similar manner, unwanted parts of the copper foil bonded to the third thick layer 31 were removed with etching techniques to form the second signal layer 4 composed of ten signal lines 1 (the width of 140 μm, the length of 10 cm, and the interval between the signal lines of 30 mm). Consequently, a printed wiring board (two-layered circuit board) as shown in FIG. 5A was obtained.

Subsequently, the first prepreg 14 and copper foil (the thickness of 12 μm) were stacked in this order, on the first signal layer 3 of the printed wiring board (two-layered circuit board) shown in the FIG. 5, and the fourth prepreg 44 and copper foil (the thickness of 12 μm) were stacked on the second signal layer 4 thereof in this order, and subsequently thus-obtained board was molded by means of heating and pressing. Consequently, a printed wiring board (four-layered circuit board) shown in FIG. 5B was obtained.

In thus-obtained printed wiring board (four-layered circuit board), the first prepreg 14 was formed into a first insulating layer 10, and the first insulating layer 10 includes a laminated structure of a first thick layer 11, the first substrate 13, and a first thin layer 12, and the fourth prepreg 44 was formed into a fourth insulating layer 40, and the fourth insulating layer 40 includes a laminated structure of a fourth thick layer 41, a fourth substrate 43, and a fourth thin layer 42. Table 1 shows a thickness $A_1$ of the first thick layer 11, a thickness $t_1$ of the first substrate 13, a thickness $B_1$ of the first thin layer 12, a thickness $A_4$ of the fourth thick layer 41, a thickness $t_4$ of the fourth substrate 43, and a thickness $B_4$ of the fourth thin layer 42.

(Difference Between Transmission Rates of Signal Lines)

With regard to the printed wiring boards of Examples 1 to 6 and Comparative Examples 1 to 5, transmission rates of the ten signal lines 1 were measured, and a difference between a maximum and a minimum of these measured values regarding respective Examples and Comparative Examples was calculated. Note that with regard to Example 6 the difference means an average of the difference of the first signal layer 3 and the difference of the second signal layer 4.

(Warp)

Each of the printed wiring boards (two-layered circuit board, three-layered circuit board, and four-layered circuit board) was evaluated in terms of a warp as follows. As for a printed wiring board such as the two-layered circuit board, such a printed wiring board was rated as "good" when an equipment trouble caused by a warp thereof did not occur, and was rated as "average" when occurrence of an equipment trouble caused by a warp thereof could be suppressed with a tool, and was rated as "poor" when an equipment trouble (e.g., transport becomes difficult) occurred due to a warp thereof. As for a printed wiring board such as the three-layered circuit board and the four-layered circuit board, such a printed wiring board was rated as "good" when a visible warp was not found, and was rated as "poor" when a visible warp was found. These results are shown in Table 1.

TABLE 1

| | | Ex. 1 | Ex. 2 | Ex. 3 | Ex. 4 | Ex. 5 | Ex. 6 | Com. Ex. 1 | Com. Ex. 2 | Com. Ex. 3 | Com. Ex. 4 | Com. Ex. 5 |
|---|---|---|---|---|---|---|---|---|---|---|---|---|
| Printed wiring board | Two-layered circuit board | FIG. 1 | FIG. 1 | FIG. 1 | FIG. 3A | FIG. 4A | FIG. 5A | FIG. 1 | FIG. 1 | FIG. 1 | FIG. 1 | FIG. 3A |
| | Three-layered circuit board | — | FIG. 2 | FIG. 2 | FIG. 3B | FIG. 4B | — | — | — | FIG. 2 | — | FIG. 3B |
| | Four-layered circuit board | — | — | — | — | — | FIG. 5B | — | — | — | — | — |
| First insulating layer | $A_1$ (μm) | 19 | 19 | 12 | 39 | 39 | 19 | 12 | 1 | 1 | 10 | 10 |
| | $t_1$ (μm) | 94 | 94 | 94 | 28 | 28 | 94 | 94 | 94 | 94 | 94 | 28 |
| | $B_1$ (μm) | 1 | 1 | 8 | 1 | 1 | 1 | 8 | 19 | 19 | 10 | 10 |
| Second insulating layer | $A_2$ (μm) | — | 19 | 12 | 39 | 39 | 19 | — | — | 1 | — | 10 |
| | $t_2$ (μm) | — | 94 | 94 | 28 | 28 | 94 | — | — | 94 | — | 28 |
| | $B_2$ (μm) | — | 1 | 8 | 1 | 1 | 1 | — | — | 19 | — | 10 |
| Third insulating layer | $A_3$ (μm) | — | — | — | 39 | 39 | 19 | — | — | — | — | 10 |
| | $t_3$ (μm) | — | — | — | 28 | 28 | 94 | — | — | — | — | 28 |
| | $B_3$ (μm) | — | — | — | 1 | 1 | 1 | — | — | — | — | 10 |
| Fourth insulating | $A_4$ (μm) | — | — | — | 39 | 39 | 19 | — | — | — | — | 10 |
| | $t_4$ (μm) | — | — | — | 28 | 28 | 94 | — | — | — | — | 28 |

TABLE 1-continued

| | Ex. 1 | Ex. 2 | Ex. 3 | Ex. 4 | Ex. 5 | Ex. 6 | Com. Ex. 1 | Com. Ex. 2 | Com. Ex. 3 | Com. Ex. 4 | Com. Ex. 5 |
|---|---|---|---|---|---|---|---|---|---|---|---|
| layer $B_4$ (μm) | — | — | — | 1 | 1 | 1 | — | — | — | — | 10 |
| Difference between trasmission rates of ten signaling lines with length of 10 cm (Max-Min) (psec) | 2 | 2 | 5 | 1 | 1 | 2 | 5 | 20 | 20 | 12 | 12 |
| Warp Two-layered circuit board | average | average | average | Good | average | Good | average | average | average | Good | Good |
| Three-layered circuit board | — | Good | Good | Good | Good | — | — | — | Good | — | Good |
| Four-layered circuit board | — | — | — | — | — | Good | — | — | — | — | — |

As apparently shown in Table 1, it is confirmed that the printed wiring boards of Examples 1 to 6 can distinctly reduce the difference between transmission rates of the signal lines 1 compared with the printed wiring boards of Comparative Examples 1 to 5.

REFERENCE SIGNS LIST

1 Signal line
2 Signal layer
3 First signal layer
4 Second signal layer
10 First insulating layer (Insulating layer)
13 First substrate (Substrate)
20 Second insulating layer
23 Second substrate
30 Third insulating layer
33 Third substrate
40 Fourth insulating layer
43 Fourth substrate

The invention claimed is:

1. A printed wiring board comprising:
an insulating layer; and
a signal layer including a set of at least two signal lines and disposed on one side of the insulating layer,
wherein:
the insulating layer is provided with a substrate embedded inside the insulating layer in such a manner to be further from the signal layer than a center of the insulating layer in a thickness direction of the insulating layer is;
the insulating layer has a laminated structure of a thick layer, the substrate, and a thin layer;
the thick layer is positioned on a side of the substrate over which the signal layer is provided;
the thin layer is positioned on an opposite side of the substrate from the side over which the signal layer is provided; and
a ratio of a thickness of the thick layer to a thickness of the thin layer is greater than five.

2. A printed wiring board comprising:
a first insulating layer;
a second insulating layer; and
a signal layer including a set of at least two signal lines and interposed between the first insulating layer and the second insulating layer,
wherein:
the first insulating layer is provided with a first substrate embedded inside the first insulating layer in such a manner to be further from the signal layer than a center of the first insulating layer in a thickness direction of the first insulating layer; and
the second insulating layer is provided with a second substrate embedded inside the second insulating layer in such a manner to be further from the signal layer than a center of the second insulating layer in a thickness direction of the second insulating layer.

3. The printed wiring board as set forth in claim 2, further comprising:
a third insulating layer which is disposed on the first insulating layer and is provided with a third substrate embedded inside the third insulating layer in such a manner to be closer to the signal layer than a center of the third insulating layer in a thickness direction of the third insulating layer; and
a fourth insulating layer which is disposed on the second insulating layer and is provided with a fourth substrate embedded inside the fourth insulating layer in such a manner to be closer to the signal layer than a center of the fourth insulating layer in a thickness direction of the fourth insulating layer.

4. The printed wiring board as set forth in claim 1, wherein:
the set of the at least two signal lines of the signal layer includes paired signal lines for differential transmission.

5. A printed wiring board comprising:
a first insulating layer;
a first signal layer including a set of at least two signal lines;
a second insulating layer;
a second signal layer including a set of at least two signal lines;
a third insulating layer; and
a fourth insulating layer,
wherein:
the first insulating layer, the first signal layer, the second insulating layer, the third insulating layer, the second signal layer, and the fourth insulating layer are stacked in this order;
the first insulating layer is provided with a first substrate embedded inside the first insulating layer in such a manner to be further from the first signal layer than a center of the first insulating layer in a thickness direction of the first insulating layer;
the second insulating layer is provided with a second substrate embedded inside the second insulating layer in such a manner to be further from the first signal layer than a center of the second insulating layer in a thickness direction of the second insulating layer;
the third insulating layer is provided with a third substrate embedded inside the third insulating layer in such a manner to be further from the second signal layer than a center of the third insulating layer in a thickness direction of the third insulating layer; and
the fourth insulating layer is provided with a fourth substrate embedded inside the fourth insulating layer in such a manner to be further from the second signal layer than a center of the fourth insulating layer in a thickness direction of the fourth insulating layer.

6. The printed wiring board as set forth in claim 5, wherein at least one of the set of the at least two signal lines of the first signal layer and the set of the at least two signal lines of the second signal layer includes paired signal lines for differential transmission.

\* \* \* \* \*